United States Patent
Chida et al.

(10) Patent No.: US 12,049,694 B2
(45) Date of Patent: Jul. 30, 2024

(54) METHOD FOR DEPOSITING BORON NITRIDE FILM AND FILM DEPOSITION APPARATUS

(71) Applicant: Tokyo Electron Limited, Tokyo (JP)

(72) Inventors: Shota Chida, Yamanashi (JP); Yosuke Watanabe, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/648,950

(22) Filed: Jan. 26, 2022

(65) Prior Publication Data

US 2022/0235457 A1    Jul. 28, 2022

(30) Foreign Application Priority Data

Jan. 27, 2021   (JP) .................... 2021-011396

(51) Int. Cl.
  *C23C 16/34*  (2006.01)
  *C23C 16/455*  (2006.01)
  *C23C 16/458*  (2006.01)

(52) U.S. Cl.
  CPC .......... *C23C 16/342* (2013.01); *C23C 16/455* (2013.01); *C23C 16/4584* (2013.01)

(58) Field of Classification Search
  CPC . C23C 16/345; C23C 16/342; C23C 16/0272; C23C 16/0281; C23C 16/455; C23C 16/4584
  See application file for complete search history.

(56) References Cited

U.S. PATENT DOCUMENTS

| | | | |
|---|---|---|---|
| 8,257,789 B2 * | 9/2012 | Matsunaga | C23C 16/45546 118/729 |
| 8,563,090 B2 * | 10/2013 | Balseanu | C23C 16/0272 427/419.1 |
| 2017/0345644 A1 * | 11/2017 | Shimizu | H01L 21/02211 |
| 2020/0027725 A1 | 1/2020 | Weimer et al. | |

FOREIGN PATENT DOCUMENTS

| | | |
|---|---|---|
| JP | 2012-531045 | 12/2012 |
| JP | 2014-033186 | 2/2014 |
| JP | 2017-175106 | 9/2017 |
| WO | 2019/193872 | 10/2019 |

* cited by examiner

*Primary Examiner* — Michael P Wieczorek
(74) *Attorney, Agent, or Firm* — IPUSA, PLLC

(57) ABSTRACT

A method for depositing a boron nitride film is provided. In the method, a seed layer is formed on a surface of a substrate by supplying an aminosilane gas to the surface of the substrate. The surface of the substrate includes bases having different incubation times for depositing a boron nitride film. A boron nitride film is deposited on the seed layer.

9 Claims, 14 Drawing Sheets

METHOD FOR DEPOSITING BORON NITRIDE FILM AND FILM DEPOSITION APPARATUS

CROSS-REFERENCE TO RELATED APPLICATION

The present application is based on and claims priority to Japanese Priority Application No. 2021-011396 filed on Jan. 27, 2021, the entire contents of which are hereby incorporated herein by reference.

BACKGROUND OF THE INVENTION

1. Field of the Invention

The present disclosure relates to a method for depositing a boron nitride film and a film deposition apparatus.

2. Description of the Related Art

Japanese Laid-Open Patent Application Publication No. 2014-33186 discloses a method for depositing a carbon film including a process of thermally decomposing a hydrocarbon-based carbon source gas and depositing a carbon film on a substrate to be processed. In the method, a film deposition temperature of a carbon film is set to a temperature that is lower than the pyrolysis temperature of a single hydrocarbon-based carbon source gas in the absence of plasma assist; a hydrocarbon-based carbon source gas and a pyrolysis temperature-lowering gas containing a halogen element are introduced into a process chamber; and a film is deposited by a non-plasma thermal CVD method.

SUMMARY OF THE INVENTION

The present disclosure provides a method for depositing a boron nitride film and a film deposition apparatus that deposit a uniform boron nitride film while equalizing incubation time even when bases are different.

According to one embodiment of the present disclosure, there is provided a method for depositing a boron nitride film. In the method, a seed layer is formed on a surface of a substrate by supplying an aminosilane gas to the surface of the substrate. The surface of the substrate includes bases having different incubation times for depositing a boron nitride film. A boron nitride film is deposited on the seed layer.

DETAILED DESCRIPTION OF THE PREFERRED EMBODIMENTS

Hereinafter, embodiments for carrying out the present invention will be described with reference to the drawings.

[Film Deposition Apparatus]

Figure 1:
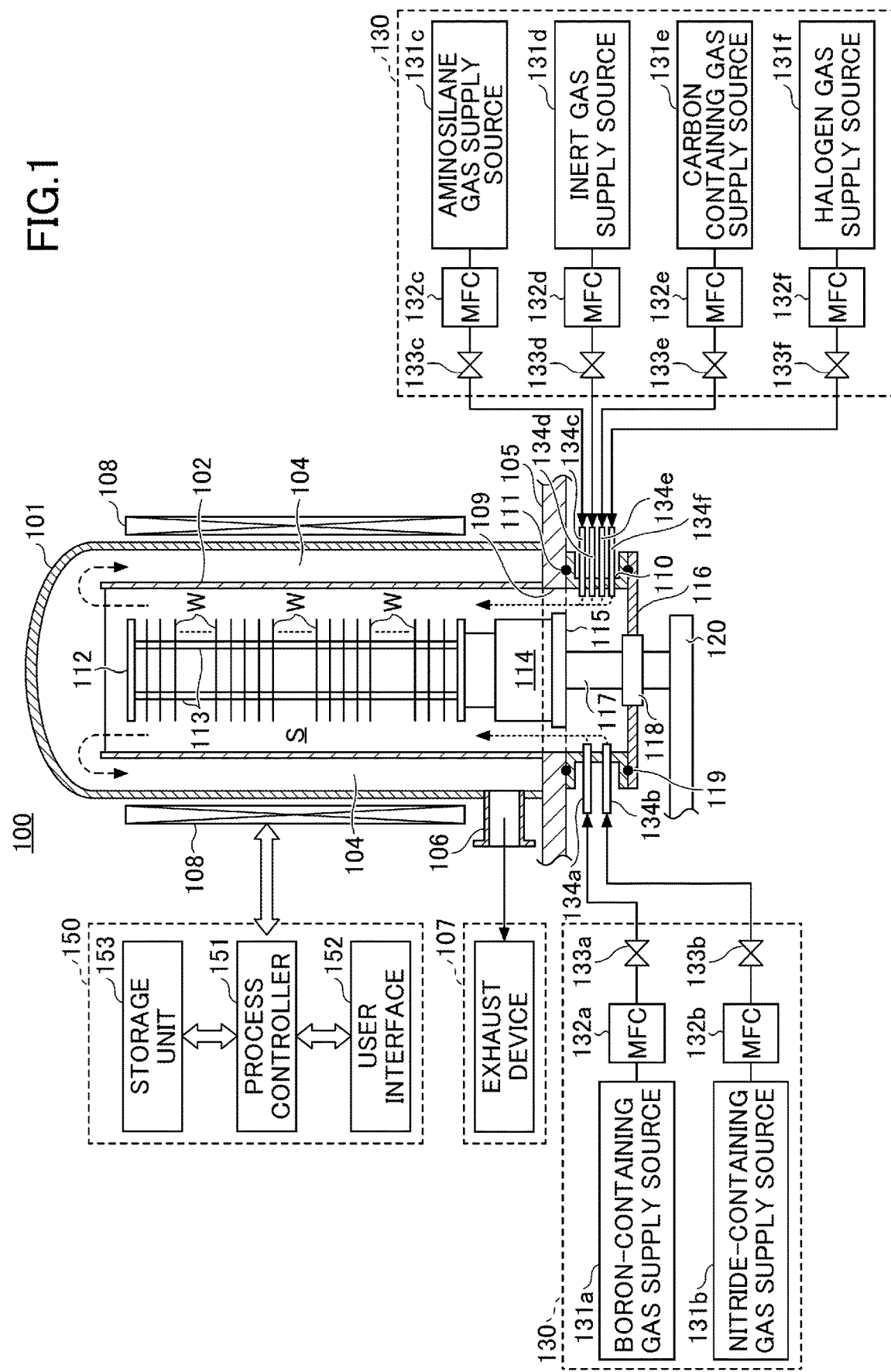
FIG. 1 is a cross-sectional view schematically illustrating an example of a film deposition apparatus according to an embodiment of the present disclosure.

FIG. 1 is a cross-sectional view schematically illustrating an example of a film deposition apparatus according to an embodiment of the present disclosure.

As illustrated in FIG. 1, a film deposition apparatus 100 is formed as a vertical batch-type film deposition apparatus and includes a cylindrical outer wall 101 with a ceiling and a cylindrical inner wall 102 disposed inside the outer wall 101. The outer wall 101 and the inner wall 102 are, for example, made with quartz, and the inner region of the inner wall 102 is a process chamber S to process a plurality of semiconductor wafers (hereinafter, simply referred to as wafers) W that are objects to be processed together.

The outer wall 101 and the inner wall 102 are horizontally separated from each other across an annular space 104 and are joined to a base material 105 at their respective lower ends. The upper end of the inner wall 102 is separated from the ceiling of the outer wall 101 so that the upper portion of the process chamber S is in communication with the annular space 104. The annular space 104 in communication with the upper portion of the process chamber S serves as an exhaust path. A gas supplied and diffused to the process chamber S flows from a lower portion of the process chamber S to an upper portion of the process chamber S and is drawn into the annular space 104. An exhaust pipe 106 is, for example, connected to the lower end of the annular space 104, and the exhaust pipe 106 is connected to an exhaust device 107. The exhaust device 107 includes a vacuum pump or the like to evacuate the process chamber S, and adjusts the inner pressure of the process chamber S to an appropriate pressure for processing.

Outside the outer wall 101, a heater 108 is disposed to surround the process chamber S. The heater 108 adjusts the temperature inside the process chamber S to an appropriate temperature for processing, and heats a plurality of wafers W together.

The lower portion of the process chamber S is in communication with an opening 109 disposed in the base material 105. The opening 109 is connected to a cylindrically-shaped manifold 110 that is, for example, made with stainless steel, via a seal member 111, such as an O-ring. The lower end of the manifold 110 is an opening through which a wafer boat 112 is inserted into the process chamber S. The wafer boat 112 is made, for example, with quartz and has a plurality of poles 113. Grooves (not illustrated) are formed in the poles 113 to support a plurality of substrates to be processed together. This allows the wafer boat 112 to receive a plurality of wafers W, for example, 50 to 150 wafers W, in multiple steps as the substrates to be processed. The wafer boat 112 having a plurality of wafers W loaded therein can be inserted into the process chamber S to accommodate a plurality of wafers W inside the process chamber S.

The wafer boat 112 is mounted on a table 115 via a heat maintaining cylinder 114 made with quartz. The table 115 is supported, for example, on a rotating shaft 117 through a lid 116 made with stainless steel. The lid 116 opens and closes the opening at the lower end of the manifold 110. A magnetic fluid seal 118, for example, is provided through the lid 116 to hermetically seal and rotatably support the rotating shaft 117. A seal member 119 made with an O-ring, for example, is interposed between the periphery of the lid 116 and the lower end of the manifold 110 to maintain the sealability of the inside of the process chamber S. The rotating shaft 117 is mounted on the distal end of an arm 120 that is supported by, for example, a lifting mechanism (not illustrated) such as a boat elevator. This causes the wafer boat 112, the lid 116, and the like to be vertically elevated and lowered together to be inserted into and removed from the process chamber S.

The film deposition apparatus 100 includes a process gas supply mechanism 130 for supplying a gas used for the process to the inside of the process chamber S.

The process gas supply mechanism 130 in this example includes a boron-containing gas supply source 131a, a nitrogen-containing gas supply source 131b, an aminosilane gas supply source 131c, and an inert gas supply source 131d. In addition, as necessary, a carbon-containing gas supply source 131e and a halogen gas supply source 131f may be included.

The boron-containing gas supply source 131a is connected to a gas supply port 134a via a mass flow controller (MFC) 132a and an open/close valve 133a. Similarly, the nitrogen-containing gas supply source 131b is connected to a gas supply port 134b via a mass flow controller (MFC) 132b and an open/close valve 133b; the aminosilane gas supply source 131c is connected to a gas supply port 134c via a mass flow controller (MFC) 132c and an open/close valve 133c; and the inert gas supply source 131d is connected to a gas supply port 134d via a mass flow controller (MFC) 132d and an open/close valve 133d. The carbon-containing gas supply source 131e is connected to a gas supply port 134e via a mass flow controller (MFC) 132e and an open/close valve 133e, and the halogen gas supply source 131f is connected to a gas supply port 134f via a mass flow controller (MFC) 132f and an open/close valve 133f.

Each of the gas supply ports 134a to 134f is disposed to horizontally penetrate the sidewall of the manifold 110 to diffuse the supplied gas into the process chamber S above the manifold 110.

The boron-containing gas supplied from the boron-containing gas supply source 131a is a gas for depositing a boron nitride film by CVD, and a variety of gases can be used as long as the gases contain boron. For example, diborane ($B_2H_6$) gas or boron trichloride ($BCl_3$) may be used as the boron-containing gas. Further, TEB (triethylborane), TMB (trimethylborane), or DMAB (dimethylaminoborane) may be used as the boron-containing gas.

The nitrogen-containing gas supplied from the nitrogen-containing gas supply source 131b is a gas for depositing a boron nitride film by CVD, and a variety of gases can be used as long as the gases contain nitrogen. For example, ammonia ($NH_3$) gas, nitrogen ($N_2$) gas may be used as the nitrogen-containing gas.

The aminosilane gas supplied from the aminosilane gas supply source 131c is a gas for depositing an aminosilane seed on the wafer W, and various aminosilane gases may be used. For example, a diisopropylaminosilane (DIPAS) gas may be used as the aminosilane gas.

The inert gas supplied from the inert gas supply source 131d is used as a purge gas or dilution gas. For example, $N_2$ gas or a noble gas such as Ar gas or He gas may be used as the inert gas.

The carbon-containing gas supplied from the carbon-containing gas supply source 131e, which is optionally provided, is a gas for depositing a carbon film by low-pressure CVD, and a variety of gases may be used as long as the gases contain carbon, and for example, a hydrocarbon-based carbon source gas may be used.

As the hydrocarbon-based carbon source gas, a gas containing hydrocarbons represented by at least one of the following molecular formulas is cited (where n is a natural number of one or more and m is a natural number of two or more):

$C_nH_{2n+2}$
$C_mH_{2m}$
$C_mH_{2m-2}$.

As the hydrocarbon-based carbon source gas,
Benzene gas ($C_6H_6$)
may be included.

As a hydrocarbon represented by a molecular formula $C_nH_{2n+2}$, the following gases may be cited:
Methane gas ($CH_4$)
Ethane gas ($C_2H_6$)
Propane gas ($C_3H_8$)
Butane gas ($C_4H_{10}$: including other isomers)
Pentane gas ($C_5H_{12}$: including other isomers).

As hydrocarbons represented by a molecular formula $C_mH_{2m}$, the following gases may be cited:
Ethylene gas ($C_2H_4$)
Propylene gas ($C_3H_6$: including other isomers)
Butylene gas ($C_4H_8$: including other isomers)
Pentene gas ($C_5H_{10}$: including other isomers).

As a hydrocarbon represented by the molecular formula $C_mH_{2m-2}$, the following gases may be cited:
Acetylene gas ($C_2H_2$)
Propyne gas ($C_3H_4$: including other isomers)
Butadiene gas ($C_4H_6$: including other isomers)
Isoprene gas ($C_5H_8$: including other isomers).

A gas containing a halogen element is used as a halogen gas supplied from the halogen gas supply source 131f. A gas containing a halogen element has a catalytic function that decreases the pyrolysis temperature of the hydrocarbon-based carbon source gas and that decreases the film deposition temperature of a carbon film by a thermal CVD method.

Elements of halogen include fluorine (F), chlorine (Cl), bromine (Br), and iodine (I). The gas containing the halogen element may be a single halogen element, that is, a simple substance of fluorine ($F_2$) gas, a simple substance of chlorine ($Cl_2$) gas, a simple substance of bromine ($Br_2$) gas, and a single iodine ($I_2$) gas, or a compound containing these gases. However, the simple substance of halogen elements does not require heat for thermal decomposition and has the advantage of decreasing the pyrolysis temperature of the hydrocarbon-based carbon source gas. Among the above-described halogen elements, fluorine may impair the surface roughness and flatness of the carbon film that is highly reactive and deposited. Therefore, chlorine, bromine, and iodine, except fluorine, are preferred as the halogen element. Of these, chlorine is preferable in terms of ease of handling.

The film deposition apparatus 100 includes a controller 150. The controller 150 includes a process controller 151 constituted of, for example, a microprocessor (computer), and control of each component of the film deposition apparatus 100 is performed by the process controller 151. A user interface 152 and a storage unit 153 are connected to the process controller 151.

The user interface 152 includes an input unit including a touch panel display or a keyboard for performing an input operation of a command to allow the operator to manage the film deposition apparatus 100, and includes a display unit including a display for visualizing and displaying an operation status of the film deposition apparatus 100.

The storage unit 153 stores what is known as a process recipe including a control program for implementing various processes executed by the film deposition apparatus 100 under the control of the process controller 151 and a program for executing the processes according to processing conditions in each component of the film deposition apparatus 100. The process recipe is stored in a storage medium in the storage unit 153. The storage medium may be a hard disk, a semiconductor memory, or a portable one such as a CD-ROM, a DVD, a flash memory, or the like. The process recipe may be also suitably transmitted from other devices, for example, via a dedicated line.

The process recipe is read from the storage unit 153 according to an operator's instruction or the like from the user interface 152 as necessary, and the process controller 151 causes the film deposition apparatus 100 to perform a process according to the read-out process recipe.

[Film Deposition Method]

When a boron nitride film is to be deposited on the wafer W, silicon (Si) and silicon dioxide ($SiO_2$) may be mixed on the surface of the wafer W.

When a boron nitride film (hereinafter, referred to as a "BN film") is deposited on such a wafer W, the times (incubation time) at which the film actually begins to be formed on silicon and on silicon dioxide may differ from each other.

Figure 2:
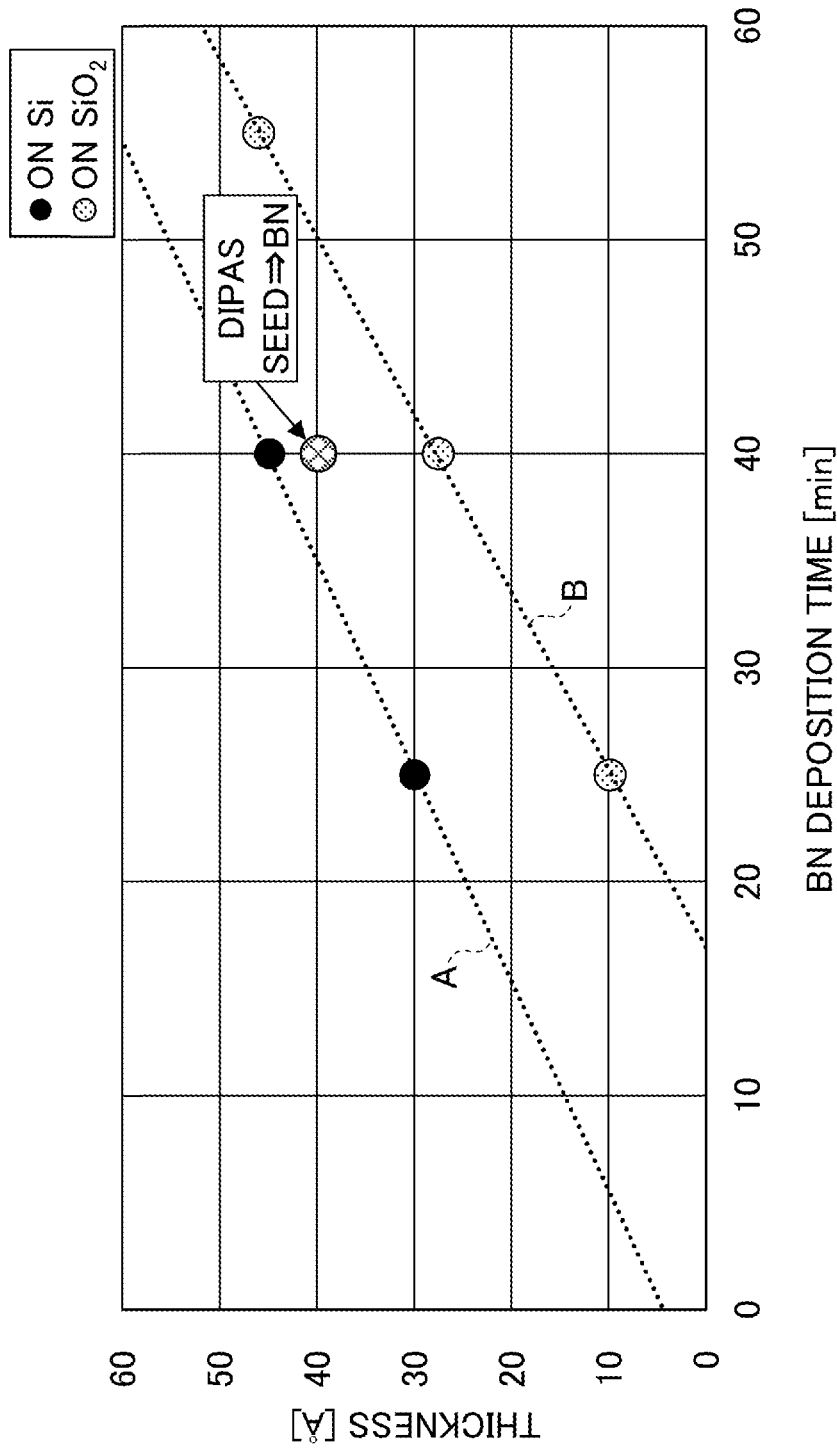
FIG. 2 is a diagram illustrating a base layer dependency in a conventional BN film deposition process.

FIG. 2 is a diagram illustrating base dependency in a conventional BN film deposition process. In FIG. 2, the horizontal axis represents time (minutes), and the vertical axis represents a film thickness (A). The film thickness time change of the BN film on the silicon base is represented as A, and the film thickness time change of the BN film on the silicon dioxide base is represented as B.

As illustrated in FIG. 2, when silicon is a base, there is no incubation time, as indicated by characteristic A, and the BN film is deposited on the wafer W shortly after the BN deposition process is started. On the other hand, when silicon dioxide is a base, there is incubation time of 17 minutes, as indicated by characteristic B.

When the bases having a difference in incubation time are present on the same wafer W, the BN film cannot be deposited with a uniform film thickness, a thick BN film is deposited on silicon, and a thin BN film is deposited on silicon dioxide, which deteriorates in-plane uniformity in film thickness across a surface of a wafer.

Therefore, in the method for depositing the boron nitride film according to the present embodiment, an aminosilane seed layer is formed on the surface of the wafer W first, and the BN film is deposited after the surface of the wafer W is set to a similar state of having a base of silicon.

Figure 3:
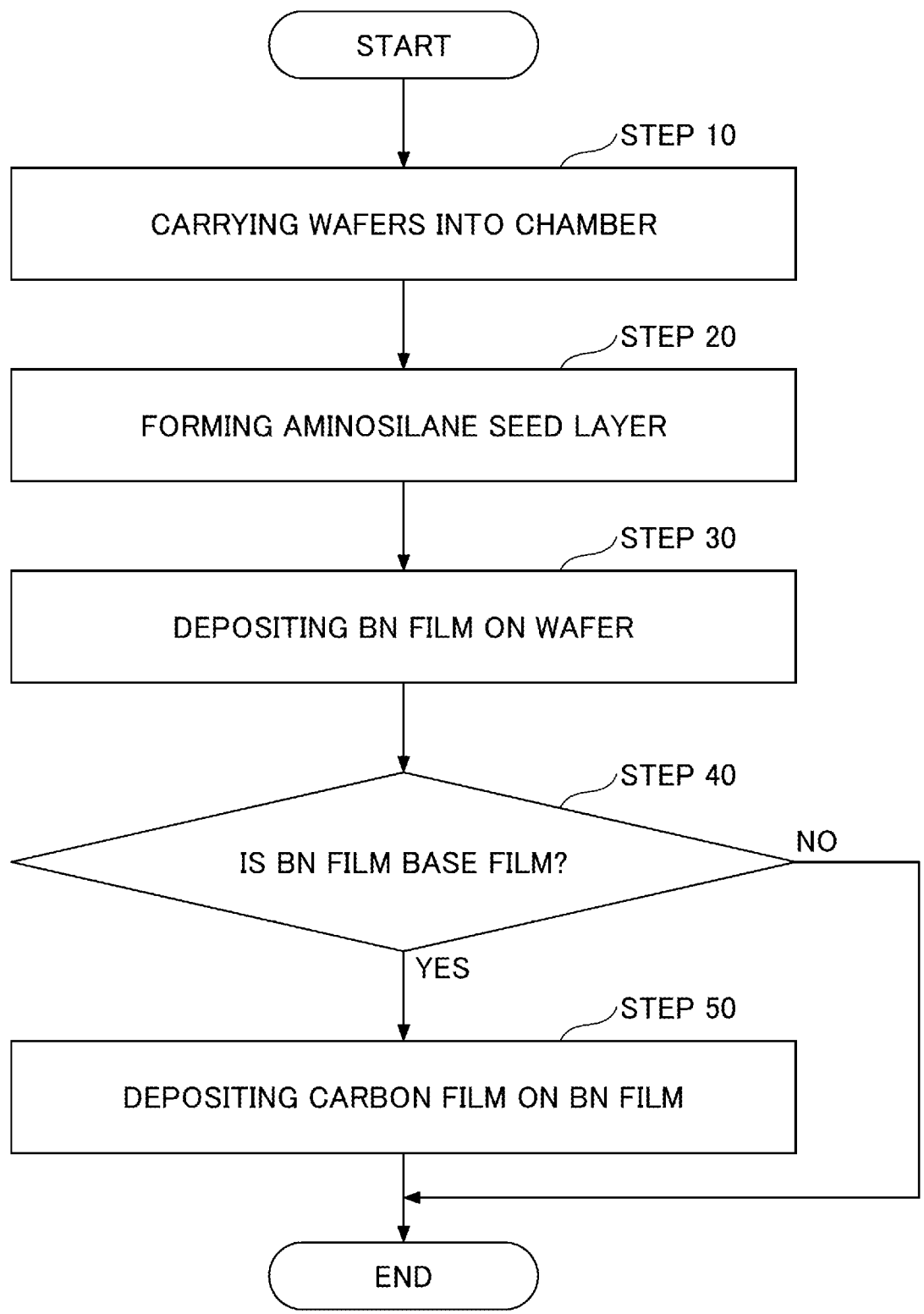
FIG. 3 is a flow chart illustrating an example of a method for forming a boron nitride film according to the present embodiment.

FIG. 3 is a flow diagram illustrating an example of a method for depositing a boron nitride film according to the present embodiment.

In FIG. 3, in Step 10, wafers W are carried into the process chamber S. Specifically, a plurality of wafers W made with silicon is loaded on the wafer boat 112, for example, 50 to 150 wafers W are loaded on the wafer boat 112, and the wafer boat 112 is inserted into the process chamber S in the film deposition apparatus 100 from below, thereby transporting a plurality of wafers W into the process chamber S (Step 10). Then, by closing the opening at the lower end of the manifold 110 with the lid 116, the inside of the process chamber S is made an enclosed space. In this state, the process chamber S is evacuated to and maintained at a predetermined degree of vacuum atmosphere; the power supply to the heater 108 is controlled to increase the wafer temperature and to maintain the process temperature; and the wafer boat 112 is rotated.

In Step 20, an aminosilane gas (for example, DIPAS) is initially supplied as a seed gas from the aminosilane gas supply source 131c so as to adsorb on the wafer surface, thereby forming an aminosilane seed to improve incubation time.

In Step 30, a boron-containing gas such as diborane ($B_2H_6$) gas as a borane-based gas or boron trichloride ($BCl_3$) gas is supplied from the boron-containing gas supply source 131a, and a nitrogen-containing gas such as ammonia or nitrogen ($N_2$) gas is supplied from the nitrogen-containing gas supply source 131b. At this time, the process chamber S is heated and a BN film is deposited on the aminosilane seed by thermal CVD. As long as the BN film can be deposited, various gases can be used as the boron-containing gas and the nitrogen-containing gas. However, $B_2H_6$ gas is most preferred as the boron-containing gas, and $NH_3$ gas is most preferred as a nitriding gas.

The temperature of the wafer W during the deposition of the BN film in Step 30 is preferably 200 to 300 degrees C. to be able to deposit the film while implementing preferable controllability.

In Step 40, it is determined whether the BN film is a base film. If the BN film is not the base film, a BN film is deposited to a predetermined film thickness, and the process flow is completed.

Conversely, when the BN film is used as the base film, for example, a base film of the carbon film, the process advances to Step 50.

In Step 50, after depositing the BN film in step 30, the process chamber S is purged and the carbon film 50 is deposited by thermal CVD without using plasma assistance.

In the film deposition process of the carbon film by thermal CVD of Step 50, the carbon-containing gas supply source 131e supplies a hydrocarbon-based carbon source gas including hydrocarbon as a carbon-containing gas, for example, $C_4H_6$ gas, into the process chamber S, while the halogen gas supply source 131f supplies a halogen gas, for example, $Cl_2$ gas, and the hydrocarbon-based carbon source gas is thermally decomposed at a predetermined temperature lower than the pyrolysis temperature, and the carbon film is deposited on the surface of the wafer W by thermal CVD.

Figure 4A:
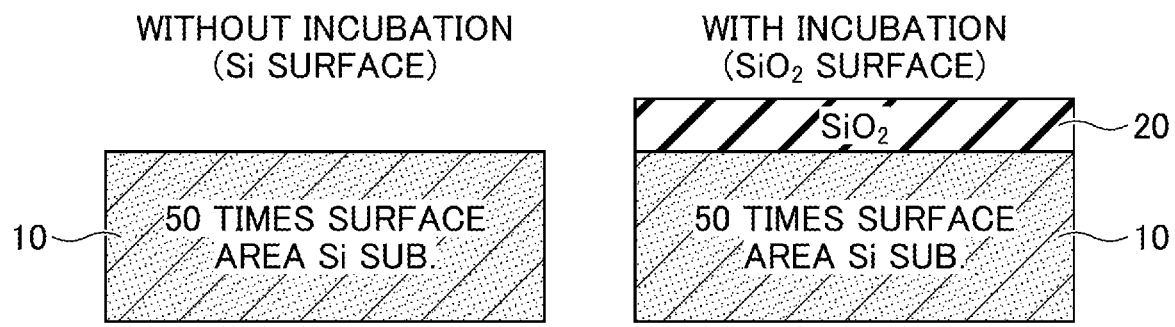
FIGS. 4A to 4C are diagrams illustrating a change on a substrate according to a method for depositing a BN film according to the present embodiment.
Figure 4B:
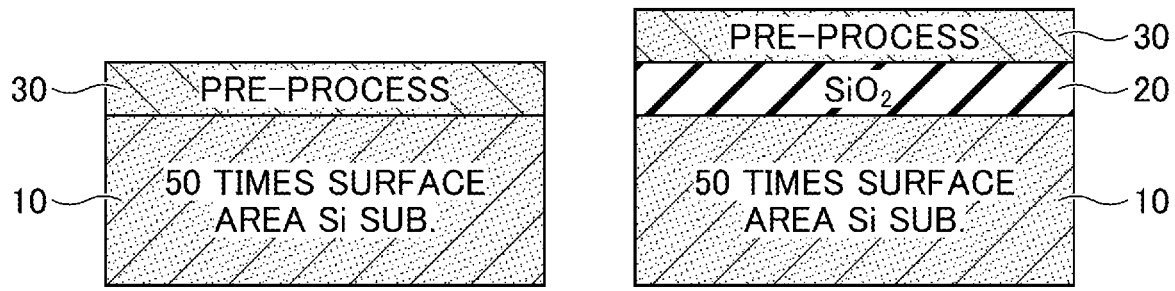
Figure 4C:
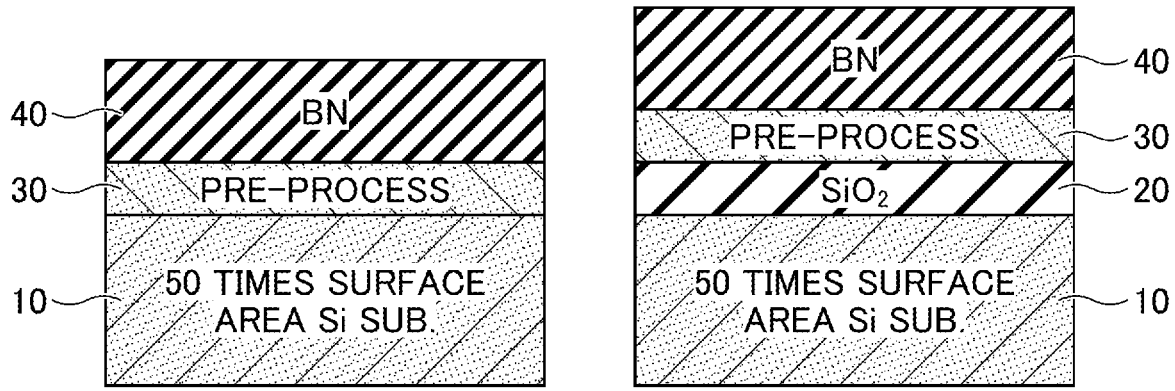

FIGS. 4A to 4C are diagrams illustrating a change on a substrate according to a method for depositing a BN film according to the present embodiment.

The left side of FIG. 4A is a cross-sectional view illustrating an exposed portion of a silicon substrate 10 having a silicon surface without incubation time. The right side of FIG. 4A is a cross-sectional view illustrating a portion where a silicon dioxide film 20 having incubation time is formed on a silicon substrate 10.

In such a state, because the portion having the base of the silicon substrate 10 has no incubation time, and because the portion having the base of the silicon dioxide film 20 has incubation time, when a BN film is deposited on the bases as is, the film thickness differs depending on the base.

FIG. 4B illustrates a state where an aminosilane gas is supplied to the substrate 10 and an aminosilane seed 30 is formed on the silicon substrate 10. In this state, both the surface of the silicon substrate 10 and the surface of the silicon dioxide film 20 are covered with the aminosilane seed 30.

FIG. 4C illustrates a BN film deposited on an aminosilane seed. In this case, the BN film relies on the incubation time on the aminosilane seed 30, because the base is all aminosilane seed 30. It is considered that there is no difference in incubation time between the silicon base and the silicon dioxide base.

Figure 5A:
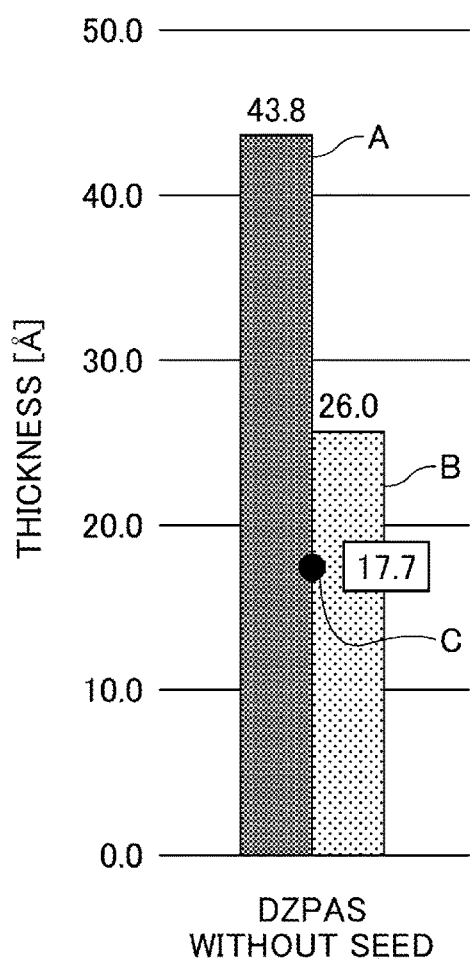
FIGS. 5A and 5B are diagrams showing the experimental results of the thickness difference between the case where the aminosilane seed 30 is formed and the case where the DIPAS, which is a type of aminosilane gas, is not formed.
Figure 5B:
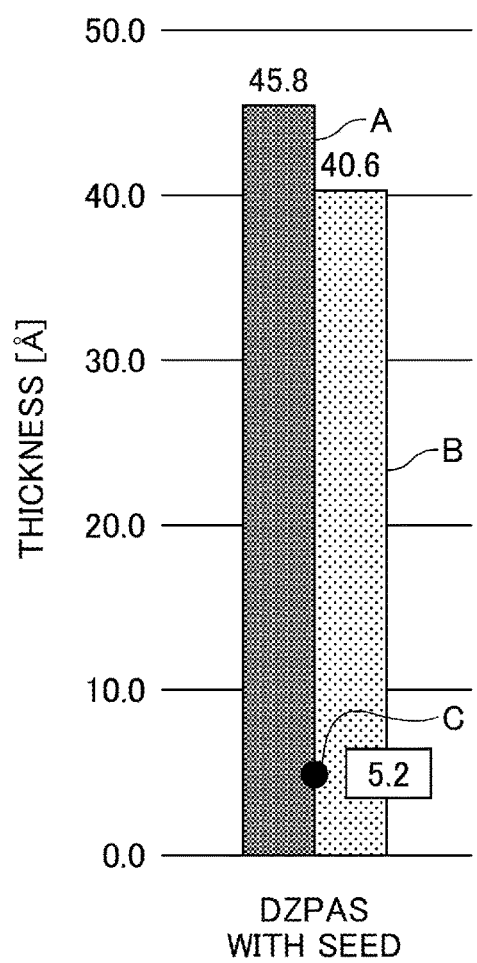

FIGS. 5A and 5B are diagrams illustrating experimental results of a thickness difference between the case where an aminosilane seed 30 is formed using DIPAS, a type of aminosilane gas, and the case where the aminosilane seed 30 is not formed.

FIG. 5A shows a difference between a film thickness A on a silicon base and a film thickness B on a silicon dioxide base without the aminosilane seed 30. As illustrated in FIG. 5A, the difference between the two is great.

FIG. 5B shows a difference between a film thickness A on a silicon base and a film thickness B on a silicon dioxide base when the aminosilane seed 30 is formed. FIG. 5B indicates that the difference between the two is very small, and that incubation time is improved.

Figure 6:
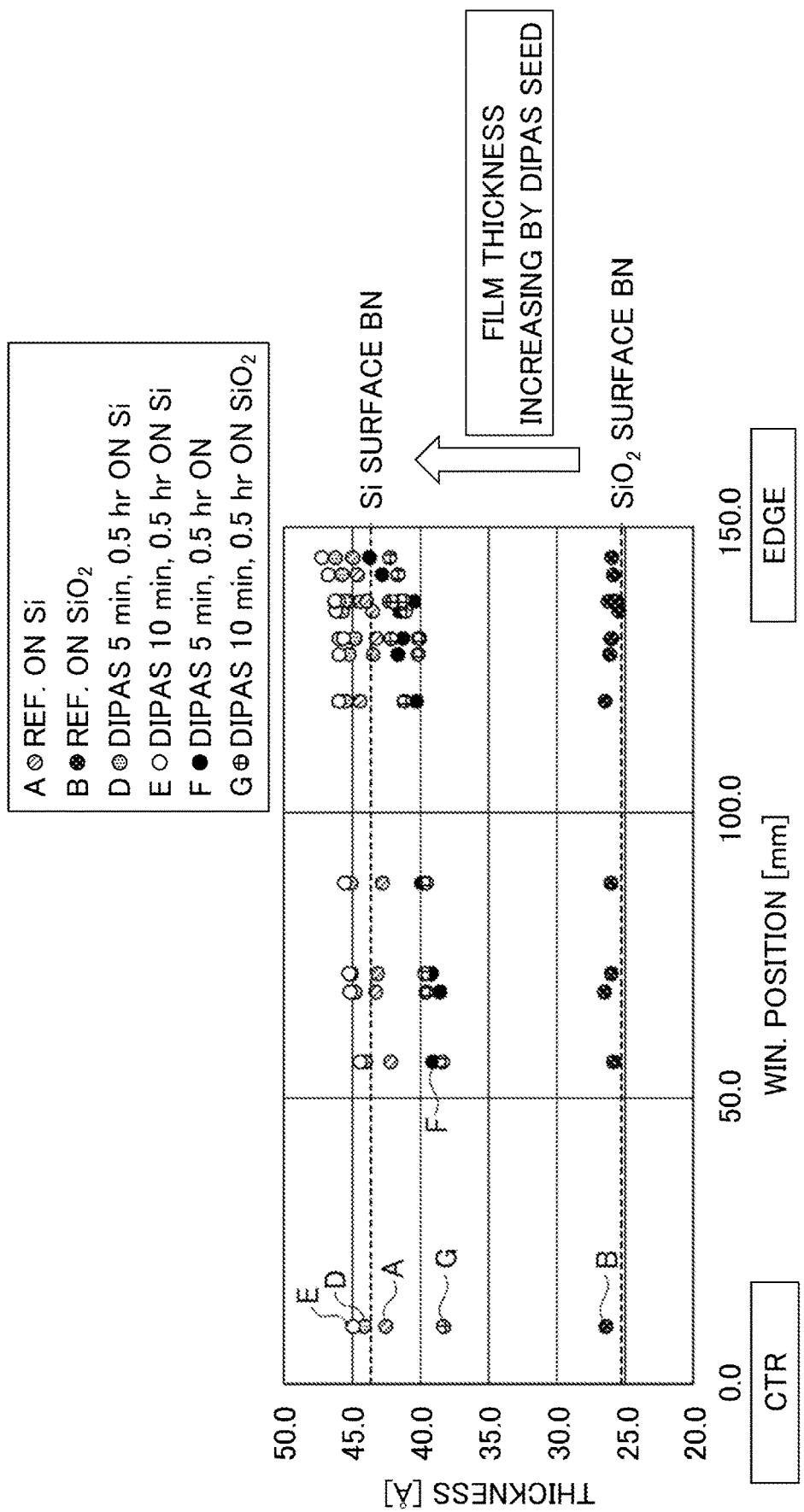
FIG. 6 is a diagram showing experimental results shown in FIGS. 5A and 5B.

FIG. 6 is a graph showing experimental results shown in FIGS. 5A and 5B. In FIG. 6, the horizontal axis represents position coordinates from the center of the wafer to the periphery, and the vertical axis represents a film thickness.

In FIG. 6, a film thickness A is a reference value of a silicon base and a film thickness B is a reference value of a silicon dioxide base without an aminosilane seed.

A film thickness D shows a case where a BN film is deposited after DIPAS is supplied at a flow rate of 500 sccm for 5 minutes on a silicon base.

A film thickness E shows a case where DIPAS is supplied at a flow rate of 200 sccm for 10 minutes on a silicon base and then a BN film is deposited.

A film thickness F shows a case where a BN film is deposited after DIPAS is supplied at a flow rate of 500 sccm for 5 minutes on a silicon dioxide base.

A film thickness G shows a case where a BN film is deposited after DIPAS is supplied at a flow rate of 200 sccm for 10 minutes on a silicon dioxide base.

In any case, the results indicate that by forming the DIPAS seed, the film thicknesses significantly approach the film thickness A of the silicon base without the DIPAS seed, compared to the film thickness B of the silicon dioxide base without the DIPAS seed.

The film thicknesses D and E, where a DIPAS seed is formed on a silicon base, have the values higher than that of the silicon base without a DIPAS seed, and the film thickness E, where DIPAS is supplied for 10 minutes at a flow rate of 200 sccm, have the greatest film thickness.

In addition, the film thicknesses F and G, where DIPAS seeds are formed on the silicon dioxide base, are much closer to the film thickness A of the silicon base and improved to a level where there is no significant difference from the film thickness A.

Thus, FIG. 6 indicates that forming the DIPAS seed layer on the entire surface of the substrate 10 reduces the material dependency of the base material and improves in-plane uniformity across a surface of a substrate.

Figure 7C:
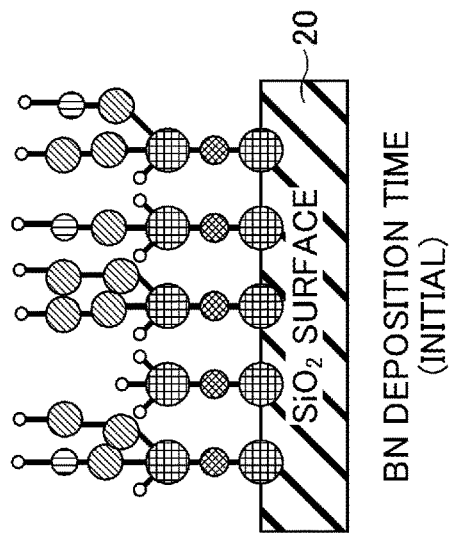
FIGS. 7A to 7C are diagrams illustrating a model diagram of a behavior of a surface of a substrate while forming an aminosilane seed.
Figure 7C:
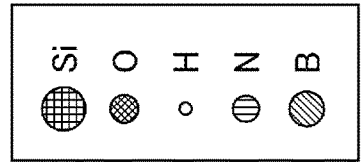
Figure 7B:
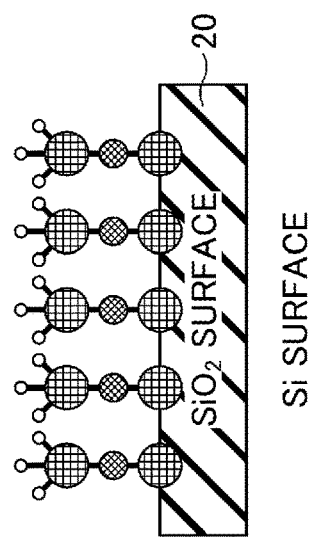
Figure 7B:
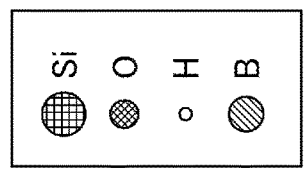
Figure 7A:
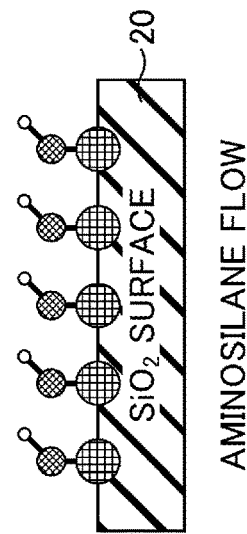
Figure 7A:
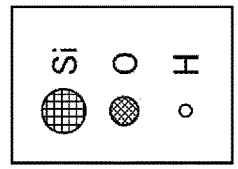

FIGS. 7A to 7C are model diagrams of behavior of a surface of a substrate 10 during aminosilane seed formation.

FIG. 7A is a model diagram of a surface of silicon dioxide. The surface contains one H terminal.

FIG. 7B shows a model of a state of performing an aminosilane flow. The aminosilane flow can increase the H terminals.

FIG. 7C illustrates a model of BN film deposition. As illustrated in FIG. 7C, because the H terminals, which form a boron adsorption site, are increased, BN is likely to be deposited.

As described above, by supplying the aminosilane gas, the H terminals can be formed many times on the silicon dioxide base, thereby making it easier to deposit a BN film.

Figure 8A:
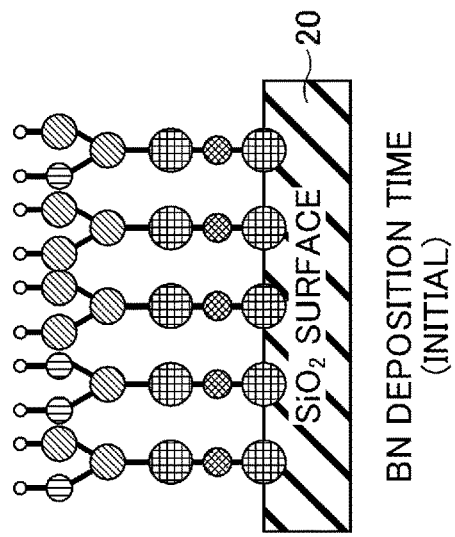
FIGS. 8A to 8C are model diagrams when supplying diborane ($B_2H_6$) after supplying aminosilane gas.
Figure 8A:
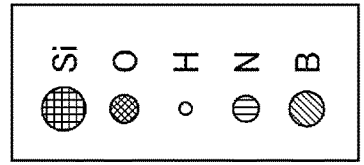
Figure 8B:
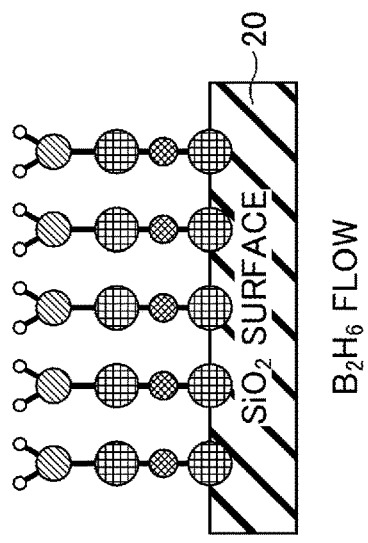
Figure 8B:
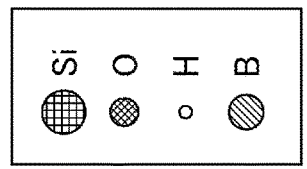
Figure 8C:
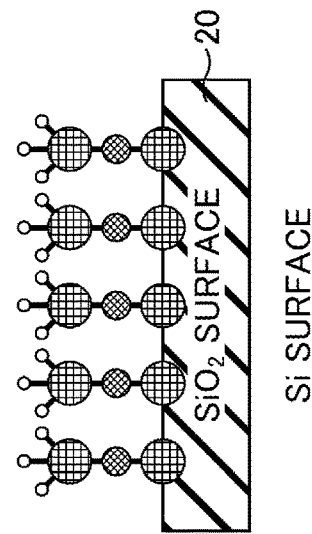
Figure 8C:
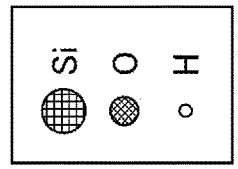

FIGS. 8A to 8C are model diagrams in the case of supplying diborane ($B_2H_6$) after supplying an aminosilane gas. It was confirmed that adding a process of supplying diborane after supplying an aminosilane gas can further eliminate the difference in incubation time. The details of this point will be described later.

FIG. 8A illustrates a state where an aminosilane gas is supplied to a silicon dioxide base. This is the same as the state in FIG. 7B.

FIG. 8B is a model diagram of a diborane supplying process. Supplying diborane would allow an adsorption site constituted of H terminals to be formed in the most electronically balanced state.

FIG. 8C is a model diagram of a BN film deposition process. BN binds without imbalance, and H terminals can be formed in a good electronic state. Thus, it is possible to further reduce the incubation time difference compared to the case of using only the aminosilane flow.

FIGS. 9A and 9B to 11A to 11D are diagrams illustrating a comparison of the methods for depositing the BN film described above.

Figure 9A:
FIGS. 9A and 9B are diagrams illustrating an example of a conventional method of depositing a BN film without forming an aminosilane seed.
Figure 9B:
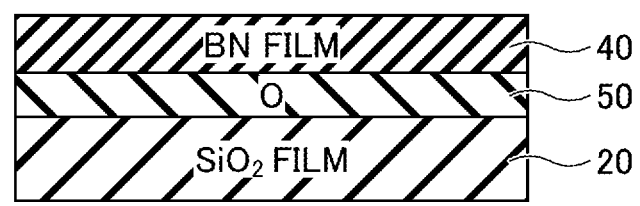

FIGS. 9A and 9B are diagrams illustrating an example of a conventional method for forming a BN film without forming an aminosilane seed.

FIG. 9A illustrates a surface state of a silicon dioxide film 20. As illustrated in FIG. 9A, OH groups 50 are formed on the surface of the silicon dioxide film 20.

FIG. 9B illustrates a state of depositing a BN film 40 on the surface of the OH groups 50 of the silicon dioxide film 20. BN is adsorbed on the H terminals of the OH groups 50, and a BN film is deposited.

Figure 10A:
FIGS. 10A to 10C are diagrams illustrating a series of processes of a BN film deposition method including a process of forming an aminosilane seed according to the present embodiment.
Figure 10B:
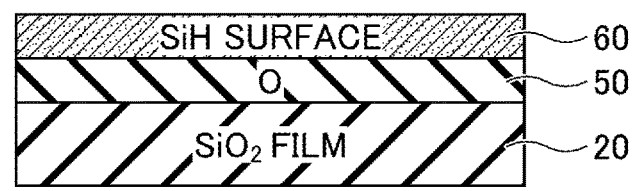
Figure 10C:
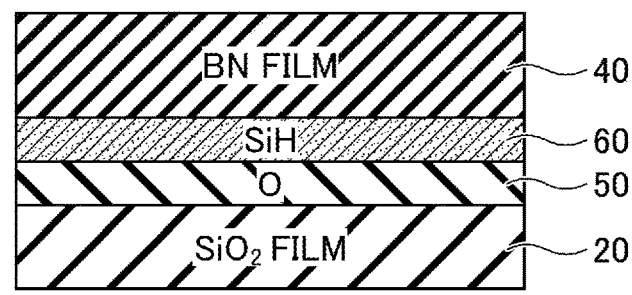

FIGS. 10A to 10C are diagrams illustrating a series of processes of a method for depositing a BN film including a process of forming an aminosilane seed according to the present embodiment.

FIG. 10A illustrates a surface state of a silicon dioxide film 20. As illustrated in FIG. 10A, OH groups 50 are formed on the surface of the silicon dioxide film 20.

FIG. 10B is a diagram illustrating a surface state after an aminosilane seed forming process. An aminosilane gas adsorbs on H terminals of the OH groups 50, and SiH groups 60 are formed on the surface. The SiH groups 60 serve as an adsorption site for a BN film.

FIG. 10C is a diagram illustrating a surface state after a BN film deposition process. BN adsorbs on the H-terminals of the SiH groups, and a BN film 40 is deposited. Thus, the SiH groups are formed on the surface by aminosilane seed flow, and the incubation time on the silicon dioxide film 20 can be decreased.

FIGS. 11A to 11D are diagrams illustrating a series of processes of a BN film deposition method including a process of forming an aminosilane seed and a process of supplying diborane according to the present embodiment.

Figure 11A:
FIGS. 11A to 11D are diagrams illustrating a series of processes of a BN film deposition method including a process of forming an aminosilane seed and a process of supplying diborane according to the present embodiment.
Figure 11B:
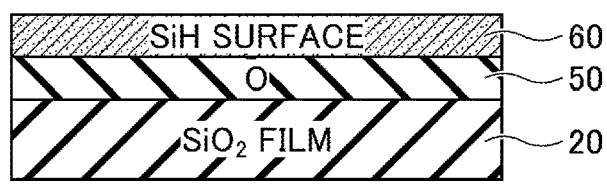

FIG. 11A and FIG. 11B are the same processes as those of FIG. 10A and FIG. 10B, and therefore, an explanation thereof is omitted.

Figure 11C:
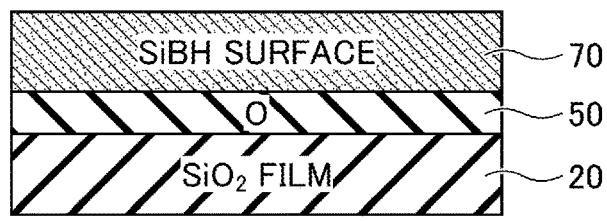

FIG. 11C is a diagram illustrating a surface state after a diborane supply process. The surface constituted of the SiH groups 60 changes to the surface constituted of SiBH groups 70. The SiBH groups 70 serve as an adsorption site that is better than that of the SiH groups 60 for BN.

Figure 11D:
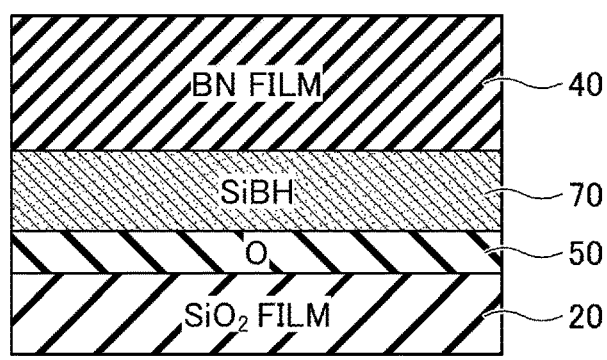

FIG. 11D is a diagram illustrating the surface condition after the BN film deposition process. The BN film can be deposited by adsorbing the BN to the H terminals of the SiBH groups 70, while further decreasing the incubation time.

In the case of supplying diborane from the boron-containing gas supply source 131a used in the BN film deposition process, diborane may be supplied from the boron-containing gas supply source 131a even in the diborane supply process.

When the boron-containing gas other than diborane is supplied in the BN film deposition process, a separate diborane supply source may be disposed, and diborane may be supplied from the separate diborane supply source.

Thus, by adding a diborane supply process to the aminosilane supply process, a better adsorption site can be formed and the difference in incubation time between the silicon base and the silicon dioxide base can be further reduced.

EXAMPLE

Figure 12:
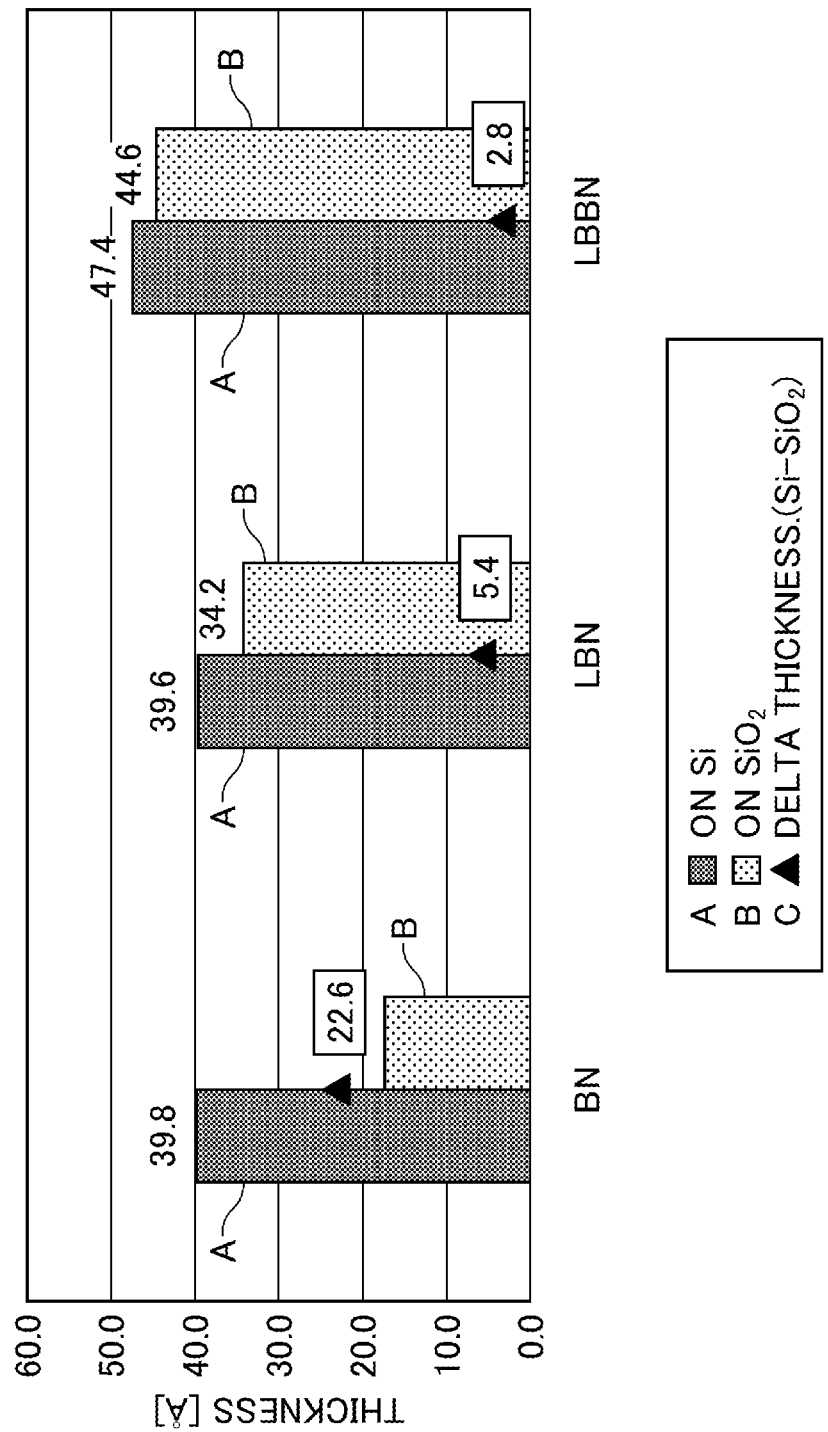
FIG. 12 is a diagram showing examples of a conventional BN film deposition method, a BN film deposition method according to the present embodiment including an aminosilane seed forming process, and a BN film deposition method according to the present embodiment including both the aminosilane seed forming process and a diborane supply process.

FIG. 12 is a diagram showing examples of performing a conventional method for depositing a BN film, a method for depositing a BN film according to the present embodiment including an aminosilane seed forming process according to the present embodiment, a method for depositing a BN film including both an aminosilane seed forming process and a diborane supply process.

FIG. 12 shows a film thickness difference between a silicon base and a silicon dioxide base of a conventional method for depositing a BN film. The central graph of FIG. 12 shows the film thickness difference between the silicon base and the silicon dioxide base of the method for depositing the BN film including the aminosilane seed forming process according to the present embodiment. The graph at the right end of FIG. 12 shows the film thickness difference between the silicon base and the silicon dioxide base of the method for depositing the BN film including the aminosilane seed forming process and the diborane supply process according to the present embodiment.

As shown in FIG. 12, compared to the conventional method for depositing the BN film at the left end, in the method for depositing the BN film according to the embodiment illustrated in the center, the film thickness at the location where silicon dioxide is the base is very close to the film thickness at the location where silicon is the base.

Moreover, in the process further including the diborane supply process shown at the right end of FIG. 12, the film thickness difference is significantly decreased, and the film thickness is significantly increased.

Thus, according to the present embodiment, the difference in incubation time can be substantially decreased by performing the aminosilane seed forming process. Furthermore, the difference in incubation time can be decreased and the deposition rate can be greatly improved by further adding the diborane supply process.

Figure 13A:
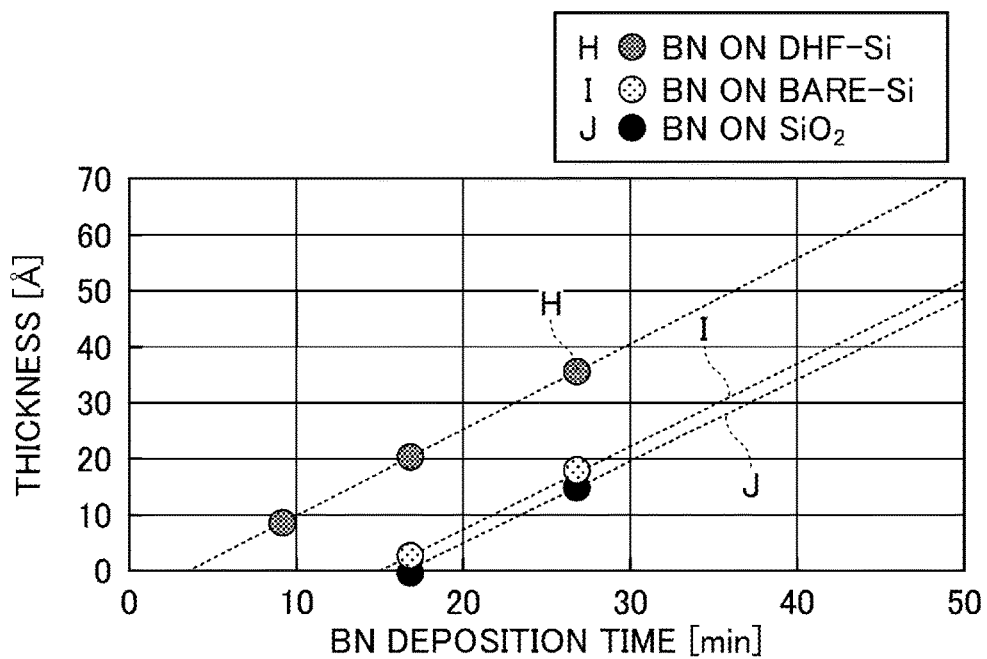
FIGS. 13A to 13C are diagrams showing results of FIG. 12 while reflecting the results in incubation time.
Figure 13B:
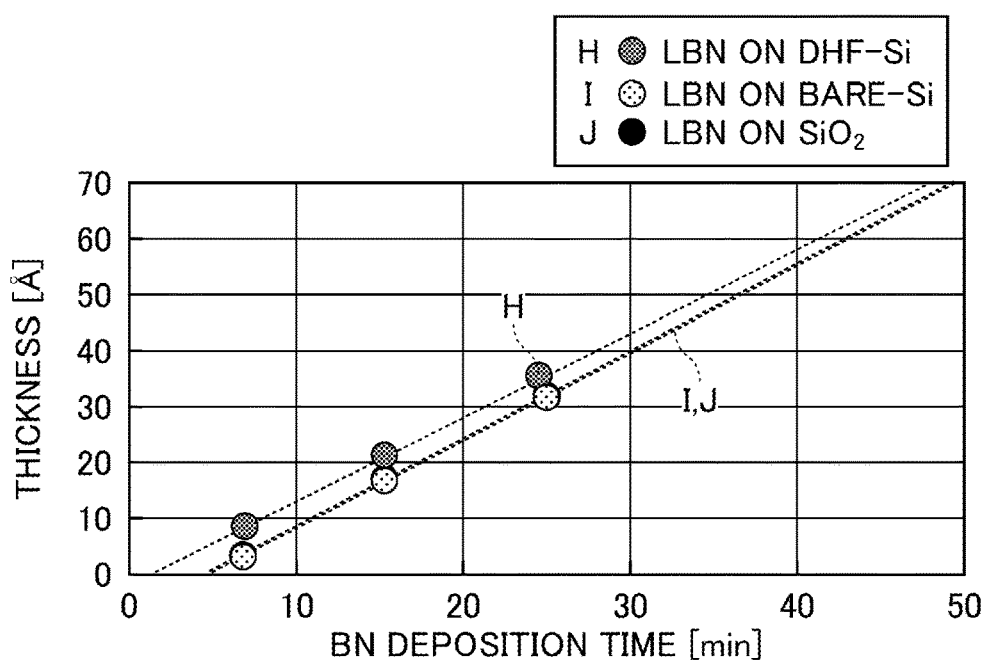
Figure 13C:
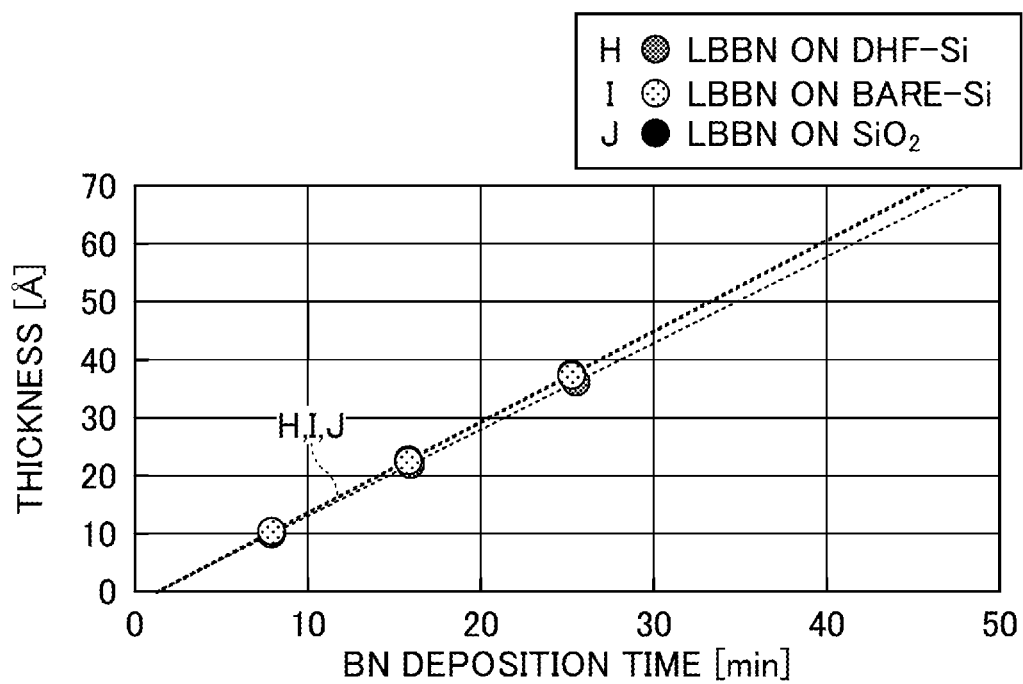

FIGS. 13A to 13C are diagrams showing results of FIG. 12 reflected in incubation time. FIG. 13A shows incubation time of a silicon base and a silicon dioxide base of a conventional method for depositing a BN film. In FIG. 13A, a time variation of a film thickness on the silicon base when a surface treatment is performed is represented as H, a time variation of a film thickness on the silicon base when a surface treatment is not performed is represented as I, and a time variation of a film thickness on the silicon dioxide base is represented as J.

As shown in FIG. 13A, the incubation time difference between the film thickness change characteristic H on the surface-treated silicon base and the film thickness change characteristic J when the silicon dioxide film is the base is great, and the incubation time difference is 14 minutes.

FIG. 13B shows a time variation of a film thickness of a BN film deposited by a method for forming a BN film including an aminosilane seed forming process according to the present embodiment.

As shown in FIG. 13B, a difference in incubation time between the film thickness change characteristic H on the surface-treated silicon base and the film thickness change characteristic J when the silicon dioxide film is the base is 4 minutes.

FIG. 13C shows a time variation of a film thickness of a BN film deposited by the method for depositing a BN film including the aminosilane seed forming process and the diborane supply process according to the present embodiment.

As shown in FIG. 13C, there is almost no difference in the incubation time between the film thickness change characteristic H on the surface-treated silicon base and the film thickness change characteristic J when the silicon dioxide film is the base, and the incubation time is 0.5 minutes.

Thus, the examples have indicated that the difference in the actual incubation time has significantly improved, and that the method for depositing the BN film according to the present embodiment can greatly decrease dependency of the incubation time on the base film.

As discussed above, according to the present disclosure, a boron nitride film can be deposited by eliminating a difference in incubation time caused by a difference of base films.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:

1. A method for depositing a boron nitride film, the method comprising:

preparing a base including a silicon base and a silicon dioxide base, said base having an upper face having a mixture of a first surface where the silicon base is provided and a second surface where the silicon dioxide base is provided, said first surface and said second surface being provided on a same plane of the base in a plan view, said silicon dioxide base having a second incubation time for forming a boron nitride film thereon, said second incubation time being different from a first incubation time for forming the boron nitride film on the silicon base, forming a seed layer on the face of the base by supplying diisopropylaminosilane gas to the face of the base at a flow rate of 500 sccm for 5 minutes or a flow rate of 200 sccm for 10 minutes; and depositing the boron nitride film on the seed layer.

2. The method as claimed in claim 1, wherein the depositing the boron nitride film on the seed layer comprises depositing the boron nitride film by Chemical Vapor Deposition on the seed layer by supplying a boron-containing gas and a nitrogen-containing gas.

3. The method as claimed in claim 2, wherein the boron-containing gas is $B_2H_6$ (diborane), $BCl_3$ (boron trichloride), TEB (triethylborane), TMB (trimethylborane), or DMAB (dimethylaminoborane), and wherein the nitrogen-containing gas is ammonia.

4. The method as claimed in claim 2, wherein the boron-containing gas is $B_2H_6$ (diborane), wherein the nitrogen-containing gas is ammonia, and wherein a difference in incubation time between a film thickness change characteristic of the boron nitride film on the silicon base and a film thickness change characteristic of the boron nitride film on the silicon dioxide base is approximately 0.5 minutes.

5. The method as claimed in claim 1, further comprising:

depositing a carbon film on the boron nitride film.

6. The method as claimed in claim 1, further comprising:

supplying a boron-containing gas to the base between the forming the seed layer and the depositing the boron nitride film.

7. The method as claimed in claim 1, wherein a difference in incubation time between a film thickness change characteristic of the boron nitride film on the silicon base and a film thickness change characteristic of the boron nitride film on the silicon dioxide base is approximately 4 minutes.

8. The method as claimed in claim 1, wherein the method further comprises supplying $C_4H_6$ gas so as to form a carbon film on the boron nitride film.

9. The method as claimed in claim 1, wherein the seed layer is formed on both of the first surface and the second surface of the base.

* * * * *